US012563976B2

(12) United States Patent
Shin

(10) Patent No.: US 12,563,976 B2
(45) Date of Patent: Feb. 24, 2026

(54) SEMICONDUCTOR DEVICE AND METHOD FOR FABRICATING THE SAME

(71) Applicant: SK hynix Inc., Icheon-si (KR)

(72) Inventor: Gwang Hyuk Shin, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 616 days.

(21) Appl. No.: 17/940,857

(22) Filed: Sep. 8, 2022

(65) Prior Publication Data

US 2023/0180626 A1 Jun. 8, 2023

(30) Foreign Application Priority Data

Dec. 7, 2021 (KR) ........................ 10-2021-0174187

(51) Int. Cl.
H10N 50/80 (2023.01)
H10B 61/00 (2023.01)
H10N 50/01 (2023.01)

(52) U.S. Cl.
CPC ............. H10N 50/80 (2023.02); H10B 61/10 (2023.02); H10N 50/01 (2023.02)

(58) Field of Classification Search
CPC ........ H10N 50/80; H10N 50/01; H10N 50/10; H10B 61/10; H10B 61/00; H10B 63/845; H10B 63/20; G06F 3/061; G06F 15/7839
See application file for complete search history.

(56) References Cited

U.S. PATENT DOCUMENTS

| | | | |
|---|---|---|---|
| 9,252,192 B2 * | 2/2016 | Lee ...................... | H10N 70/063 |
| 9,741,764 B1 * | 8/2017 | Terai ...................... | H10B 63/24 |
| 10,023,469 B2 * | 7/2018 | Cho ...................... | C01B 32/186 |
| 2010/0221896 A1 * | 9/2010 | Sandoval ............. | H10N 70/882 |
| | | | 257/E21.09 |
| 2020/0006637 A1 | 1/2020 | Gosavi et al. | |
| 2020/0075676 A1 | 3/2020 | Salahuddin et al. | |
| 2020/0264248 A1 | 8/2020 | Xu et al. | |

FOREIGN PATENT DOCUMENTS

| | | |
|---|---|---|
| KR | 20160020105 A | 2/2016 |
| KR | 20180069463 A | 6/2018 |

OTHER PUBLICATIONS

Bunch, J.S., et al., "Impermeable Atomic Membrane from Graphene Sheets." Nano Letters, vol. 8, No. 8, 2008, pp. 2458-2462.
Han, T.H. et al., "Extremely efficient flexible organic light-emitting diodes with modified graphene anode." Nature Photonics, Jan. 10, 2012, pp. 105-110.

(Continued)

*Primary Examiner* — Allison Bernstein
(74) *Attorney, Agent, or Firm* — Perkins Coie LLP

(57) ABSTRACT

A semiconductor device may include: first conductive lines; second conductive lines disposed on the first conductive lines to be spaced apart from the first conductive lines; selector layer disposed between the first conductive lines and the second conductive lines; a variable resistance layer disposed between the first conductive lines and the second conductive lines; and a first electrode layer including graphene and disposed between the variable resistance layer and the selector layer.

14 Claims, 8 Drawing Sheets

(56)                    References Cited

OTHER PUBLICATIONS

Kobayashi, T. et al., "Production of a 100-0-long high-quality graphene transparent conductive film by roll-to-roll chemical vapor deposition and transfer process." Appl. Phys. Lett. 102, 023112, 2013, 5 pages.
Lee, Y. et al., "Wafer-Scale Synthesis and Transfer of Graphene Films." Nano Letters, 2010, 10, pp. 490-493.
Meyer, J.C. et al., "On the roughness of single-and bi-layer graphene membranes." ScienceDirect, Solid State Communications 143, 2007, pp. 101-109.
Yang, H. et al., "Graphene Barristor, a Triode Device with a Gate-Controlled Schottky Barrier." Science, vol. 336, Jun. 1, 2012, 5 pages.
Request for the Submission of an Opinion for KR Appl. No. 10-2021-0174187, mailed on Dec. 17, 2024, 18 pages with English translation.
Linfeng Sun et al., "Self-selective van der Waals heterostructures for large scale memory array," Nature Communications, vol. 10, No. 3161, 7 pages.
Request for the Submission of an Opinion for KR Appl. No. 10-2021-0174187, mailed on Aug. 27, 2025, 18 pages with English translation.

* cited by examiner

34

33

33

35

SEMICONDUCTOR DEVICE AND METHOD FOR FABRICATING THE SAME

PRIORITY CLAIM AND CROSS-REFERENCE TO RELATED APPLICATION

This patent document claims the priority and benefits of Korean Patent Application No. 10-2021-0174187 filed on Dec. 7, 2021, which is incorporated herein by reference in its entirety.

TECHNICAL FIELD

This patent document relates to memory circuits or devices and their applications in electronic devices or systems.

BACKGROUND

The recent trend toward miniaturization, low power consumption, high performance, and multi-functionality in the electrical and electronics industry has compelled the semiconductor manufacturers to focus on high-performance, high capacity semiconductor devices. Examples of such high-performance, high capacity semiconductor devices include memory devices that can store data by switching between different resistance states according to an applied voltage or current. The semiconductor devices may include an RRAM (resistive random access memory), a PRAM (phase change random access memory), an FRAM (ferroelectric random access memory), an MRAM (magnetic random access memory), and an electronic fuse (E-fuse).

SUMMARY

The disclosed technology in this patent document includes memory circuits or devices and their applications in semiconductor devices or systems and various implementations of a semiconductor device that can improve the performance of a semiconductor device and reduce manufacturing defects.

In one aspect, a semiconductor device may include: first conductive lines; second conductive lines disposed on the first conductive lines to be spaced apart from the first conductive lines; selector layer disposed between the first conductive lines and the second conductive lines; a variable resistance layer disposed between the first conductive lines and the second conductive lines; and a first electrode layer including graphene and disposed between the variable resistance layer and the selector layer.

In another aspect, a method for fabricating a semiconductor device may include: forming a first conductive line; forming a selector layer over the first conductive line; forming a first electrode layer that includes graphene over the selector layer; forming a variable resistance layer; and forming a second conductive line over the variable resistance layer.

DETAILED DESCRIPTION

Hereinafter, various embodiments of the disclosure will be described in detail with reference to the accompanying drawings.

Figure 1A:
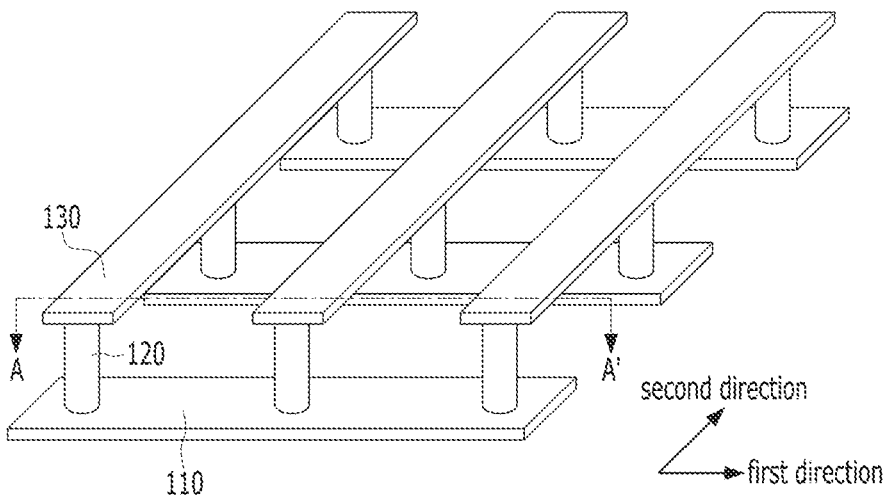
FIGS. 1A and 1B illustrate a semiconductor device based on some implementations of the disclosed technology.
Figure 1B:
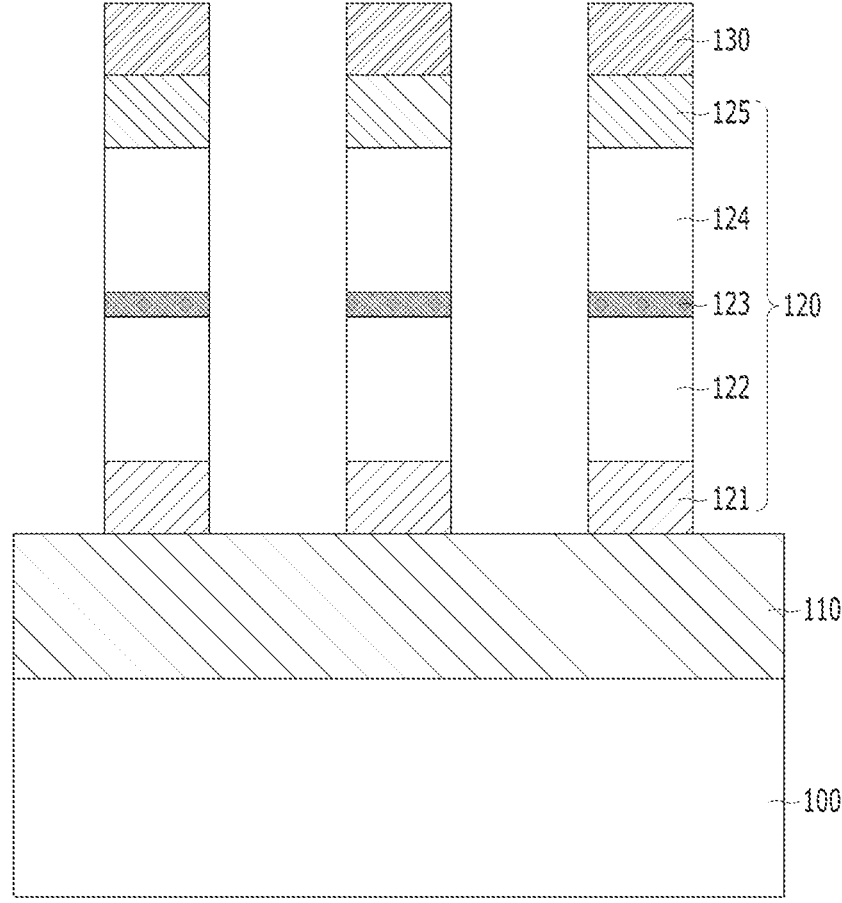

FIGS. 1A and 1B illustrate a semiconductor device based on some implementations of the disclosed technology. FIG. 1A is a perspective view, and FIG. 1B is a cross-sectional view taken along line A-A' of FIG. 1A.

Referring to FIGS. 1A and 1B, the semiconductor device may include a cross-point structure including a substrate 100, first conductive lines 110 formed over the substrate 100 and extending in a first direction, second conductive lines 130 formed over the first conductive lines 110 to be spaced apart from the first conductive lines 110 and extending in a second direction crossing the first direction, memory cells 120 disposed at intersections of the first conductive lines 110 and the second conductive lines 130 between the first conductive lines 110, the second conductive lines 130, a protection layer (not shown) and an encapsulation layer (not shown).

The substrate 100 may include a semiconductor material such as silicon. A required lower structure (not shown) may be formed in the substrate 100. For example, the substrate 100 may include a driving circuit (not shown) electrically connected to the first conductive lines 110 and/or the second conductive lines 130 to control operations of the memory cells 120. In this patent document, the conductive lines can indicate conductive structures that electrically connect two or more circuit elements in the semiconductor device. In some implementations, the conductive lines include word lines that are used control access to memory cells in the memory device and bit lines that are used to read out information stored in the memory cells. In some implementations, the conductive lines include interconnects that carry signals between different circuit elements in the semiconductor device.

The first conductive lines 110 and the second conductive lines 130 may be connected to a lower end and an upper end of the memory cell 120, respectively, and may provide a voltage or a current to the memory cell 120 to drive the memory cell 120. When the first conductive lines 110 functions as a word line, the second conductive lines 130 may function as a bit line. Conversely, when the first conductive lines 110 functions as a bit line, the second conductive lines 130 may function as a word line. The first conductive lines 110 and the second conductive lines 130 may include a single-layer or multilayer structure including one or more of various conductive materials. Examples of the conductive materials may include a metal, a metal nitride, or a conductive carbon material, or a combination thereof, but are not limited thereto. For example, the first conductive lines 110 and the second conductive lines 130 may include tungsten (W), titanium (Ti), tantalum (Ta), platinum (Pt), aluminum (Al), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

The memory cell 120 may be arranged in a matrix having rows and columns along the first direction and the second direction so as to overlap the intersection regions between the first conductive lines 110 and the second conductive lines 130. In an implementation, each of the memory cells 120 may have a size that is substantially equal to or smaller than that of the intersection region between each corresponding pair of the first conductive lines 110 and the second conductive lines 130. In another implementation, each of the memory cells 120 may have a size that is larger than that of the intersection region between each corresponding pair of the first conductive lines 110 and the second conductive lines 130.

Spaces between the first conductive lines 110, the second conductive lines 130 and the memory cell 120 may be filled with an insulating material.

The memory cell 120 may include a stacked structure including a lower electrode layer 121, a selector layer 122, a middle electrode layer 123, a variable resistance layer 124 and an upper electrode layer 125. In the specific example illustrated in FIGS. 1A, 1B and 1C, the words "lower," "middle," and "upper" that are used in conjunction with electrode layers are used to indicate their relative locations within the stacked structure in this example. In various implementations, the lower electrode layer 121 may or may not be located at a lower portion of the stacked structure, the middle electrode layer 123 may or may not be located at a middle portion of the stacked structure, and the upper electrode layer 125 may or may not be located at an upper portion of the stacked structure. In some implementations, the upper electrode layer 125 is disposed over the middle electrode layer 123 and the upper electrode layer 125, and the middle electrode layer 123 is disposed over the upper electrode layer 125.

The lower electrode layer 121 may be interposed between the first conductive line 110 and the selector layer 122 and disposed at a lowermost portion of each of the memory cells 120. The lower electrode layer 121 may function as a circuit node that carries a current or applies a voltage between one of the first conductive lines 110 and the remaining portion (e.g., the elements 122, 123, 124 and 125) of each of the memory cells 120. The middle electrode layer 123 may be interposed between the selector layer 122 and the variable resistance layer 124. The middle electrode layer 123 may electrically connect the selector layer 122 and the variable resistance layer 124 to each other while physically isolating or separating the selector layer 122 and the variable resistance layer 124 from each other. The upper electrode layer 125 may be disposed at an uppermost portion of the memory cell 120 and function as a transmission path of electrical signals such as a voltage or a current between a material layer in the memory cell 120 and one of the second conductive lines 130.

The lower electrode layer 121 and the upper electrode layer 125 may include a single-layer or multilayer structure including various conductive materials such as a metal, a metal nitride, a conductive carbon material, or a combination thereof, respectively. For example, the lower electrode layer 121, the middle electrode layer 123 and the upper electrode layer 125 may include tungsten (W), titanium (Ti), tantalum (Ta), platinum (Pt), aluminum (Al), copper (Cu), copper (Cu), zinc (Zn), nickel (Ni), cobalt (Co), lead (Pb), tungsten nitride (WN), tungsten silicide (WSi), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), carbon (C), silicon carbide (SiC), or silicon carbon nitride (SiCN), or a combination thereof.

The lower electrode layer 121 and the upper electrode layer 125 may include the same material as each other or different materials from each other.

The lower electrode layer 121 and the upper electrode layer 125 may have the same thickness as each other or different thicknesses from each other.

In some implementations, a middle electrode disposed between the selector layer 122 and the variable resistance layer 124 may include various conductive materials such as titanium nitride (TiN). Here, the middle electrode may correspond to the middle electrode layer 123 discussed above. However, due to its high surface roughness, such a TiN middle electrode may negatively affect the performance and yield of the variable resistance layer 124 in a magnetic tunnel junction (MTJ) structure. Further, during an additional etch process for patterning the middle electrode, the selector layer 122 may be damaged and the process time and cost may increase. Further, the selector layer 122 may also be damaged due to redeposition and shunt failure of the MTJ. Moreover, the increase in the thickness of a hard mask pattern for patterning the memory cell 120 by a thickness of the middle electrode may result in the increase in the process time and cost.

In some implementations, the middle electrode layer 123 disposed between the selector layer 122 and the variable resistance layer 124 may include graphene to address such issues. Graphene is an allotrope of carbon consisting of a single layer of atoms arranged in a two-dimensional honeycomb lattice nanostructure. Graphene has a high physical-chemical stability, high malleability, high electron mobility, low resistance, high thermal conductivity, excellent impermeability, large Young's modulus, and a large theoretical specific surface area. Accordingly, graphene is being widely used for displays, secondary batteries, solar cells, automobiles, and lighting. In one example, graphene can be used as an electrode (e.g., an anode) of an organic light emitting diode (OLED) to improve the electrical properties of the electrode. Graphene may be formed by a physical peeling process, a chemical deposition process, a chemical peeling process, an epitaxial growth process, or others. For example, large-area synthesis of graphene may be achieved by chemical vapor deposition (CVD).

In some implementations, the middle electrode layer 123 may include graphene. In some implementations, graphene may have flat surface properties with low surface roughness, excellent impermeability, small thickness and proper conductivity in a vertical direction.

The middle electrode layer 123 may be disposed between the variable resistance layer 124 and the selector layer 122 to physically isolate or separate the variable resistance layer 124 and the selector layer 122 from each other. In some implementations, the middle electrode layer 123 that includes graphene may have excellent impermeability to block small particles or molecules such as helium, physically isolating the variable resistance layer 124 and the selector layer 122 from each other. Therefore, during the formation of material layers that will constitute the variable resistance layer 124, the middle electrode layer 123 can prevent or reduce diffusion of the materials into the selector layer 122.

Further, graphene has an atomically thin hexagonal structure, and, in some implementations, one graphene layer may have a thickness of about 0.3 nm. Covalent bonds in a horizontal direction and Van der Waals bonds in a vertical direction allow graphene to have low surface roughness. Accordingly, the middle electrode layer 123 that includes graphene can have a smaller thickness and lower surface roughness compared to conventional conductive materials such as TiN. Therefore, the middle electrode layer 123 that includes graphene can improve the performance of the variable resistance layer 124.

Moreover, the middle electrode layer 123 may be etched concurrently with the etching of the variable resistance layer 124 without performing a separate etch process for patterning the middle electrode layer 123 reducing or preventing damage to the selector layer 122 that would have resulted from the separate etch process and shunt failure of the variable resistance layer 124 that would have resulted from redeposition. In addition, the process time and cost may be decreased.

In some implementations, the middle electrode layer 123 may include monolayer graphene or multilayer graphene. In some implementations, the word "monolayer" may be used to indicate a thin film with atomic thickness. For example, the monolayer graphene may have a thickness of about 0.3 nm. Therefore, even if the middle electrode layer 123 includes multilayer graphene, the middle electrode layer 123 may have a small thickness compared to another example middle electrode that is formed of TiN. Therefore, the thickness of the hard mask pattern for patterning the memory cell 120 can be reduced, thereby decreasing the process time and cost.

In some implementations, the middle electrode layer 123 is formed of multilayer graphene that includes 2-7 layers. As graphene becomes thicker beyond a certain level, resistance may increase. However, resistance may decrease as the thickness of graphene increases if the thickness is below the certain level. For example, resistance may decrease as the thickness of graphene increases if graphene includes 7 or less layers. In some implementations of the disclosed technology, the middle electrode layer 123 may include multilayer graphene that includes 7 or less layers. In case that graphene has a thickness greater than 7 layers, a current may not increase even if the thickness of graphene is increased. In addition, when the middle electrode layer 123 includes excessively thick graphene, the thickness of the hard mask pattern for etching the memory cell 120 needs to increase and thus the time required for the etching process and the difficulty of the etching process may increase.

The variable resistance layer 124 may be used to store data by switching between different resistance states (e.g., high and low resistance states to represent digital level "1" and "0" or vice versa) according to an applied voltage or current. The variable resistance layer 124 may have a single-layered structure or a multilayered structure including at least one of materials having a variable resistance characteristic used for an RRAM, a PRAM, an MRAM, an FRAM, and others. For example, the variable resistance layer 124 may include a metal oxide such as a transition metal oxide or a perovskite-based oxide, a phase change material such as a chalcogenide-based material, a ferromagnetic material, a ferroelectric material, or others. However, the implementations of the disclosed technology are not limited thereto, and the memory cell 120 may include other memory layers capable of storing data in various ways instead of the variable resistance layer 124.

In some implementations, the variable resistance layer 124 may include a magnetic tunnel junction (MTJ) structure, as will be discussed below with reference to FIG. 1C.

Figure 1C:
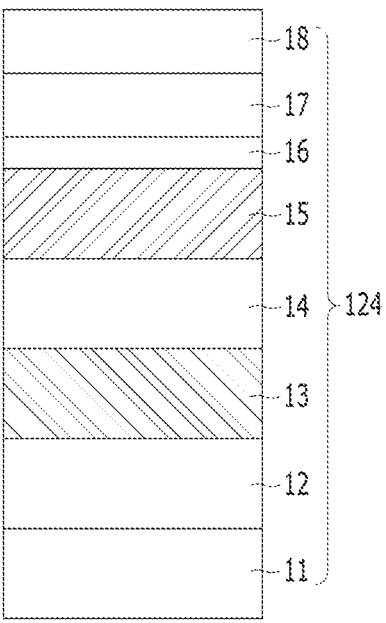
FIG. 1C illustrates an example of a magnetic tunnel junction (MTJ) structure included in a variable resistance layer based on some implementations of the disclosed technology.

FIG. 1C illustrates an example of a magnetic tunnel junction (MTJ) structure included in the variable resistance layer 124.

The variable resistance layer 124 may include an MTJ structure including a free layer 13 having a variable magnetization direction, a pinned layer 15 having a pinned magnetization direction and a tunnel barrier layer 14 interposed between the free layer 13 and the pinned layer 15.

The free layer 13 may have one of different magnetization directions or one of different spin directions of electrons to switch the polarity of the free layer 13 in the MTJ structure, resulting in changes in resistance value. In some implementations, the polarity of the free layer 13 is changed or flipped upon application of a voltage or current signal (e.g., a driving current above a certain threshold) to the MTJ structure. With the polarity changes of the free layer 13, the free layer 13 and the pinned layer 15 have different magnetization directions or different spin directions of electron, which allows the variable resistance layer 124 to store different data or represent different data bits. The free layer 13 may also be referred to as a storage layer. The magnetization direction of the free layer 13 may be substantially perpendicular to a surface of the free layer 13, the tunnel barrier layer 14 and the pinned layer 15. In other words, the magnetization direction of the free layer 13 may be substantially parallel to stacking directions of the free layer 13, the tunnel barrier layer 14 and the pinned layer 15. Therefore, the magnetization direction of the free layer 13 may be changed between a downward direction and an upward direction. The change in the magnetization direction of the free layer 13 may be induced by a spin transfer torque generated by an applied current or voltage.

The free layer 13 may have a single-layer or multilayer structure including a ferromagnetic material. For example, the free layer 13 may include an alloy based on Fe, Ni or Co, for example, an Fe—Pt alloy, an Fe—Pd alloy, a Co—Pd alloy, a Co—Pt alloy, a Co—Fe alloy, an Fe—Ni—Pt alloy, a Co—Fe—Pt alloy, a Co—Ni—Pt alloy, or a Co—Fe—B alloy, or others, or may include a stack of metals, such as Co/Pt, or Co/Pd, or others.

The tunnel barrier layer 14 may allow the tunneling of electrons in both data reading and data writing operations. In a write operation for storing new data, a high write current may be directed through the tunnel barrier layer 14 to change the magnetization direction of the free layer 13 and thus to change the resistance state of the MTJ for writing a new data bit. In a reading operation, a low reading current may be directed through the tunnel barrier layer 14 without changing the magnetization direction of the free layer 13 to measure the existing resistance state of the MTJ under the existing magnetization direction of the free layer 13 to read the stored data bit in the MTJ. The tunnel barrier layer 14 may include a dielectric oxide such as MgO, CaO, SrO, TiO, VO, or NbO or others.

The pinned layer 15 may have a pinned magnetization direction, which remains unchanged while the magnetization direction of the free layer 13 changes. The pinned layer 15 may be referred to as a reference layer. In some implementations, the magnetization direction of the pinned layer 15 may be pinned in a downward direction. In some implementations, the magnetization direction of the pinned layer 15 may be pinned in an upward direction.

The pinned layer 15 may have a single-layer or multilayer structure including a ferromagnetic material. For example, the pinned layer 15 may include an alloy based on Fe, Ni or Co, for example, an Fe—Pt alloy, an Fe—Pd alloy, a Co—Pd alloy, a Co—Pt alloy, a Co—Fe alloy, an Fe—Ni—

Pt alloy, a Co—Fe—Pt alloy, a Co—Ni—Pt alloy, or a Co—Fe—B alloy, or may include a stack of metals, such as Co/Pt, or Co/Pd or others.

If a voltage or current is applied to the variable resistance layer 124, the magnetization direction of the free layer 13 may be changed by spin torque transfer. In some implementations, when the magnetization directions of the free layer 13 and the pinned layer 15 are parallel to each other, the variable resistance layer 124 may be in a low resistance state, and this may indicate digital data bit "0." Conversely, when the magnetization directions of the free layer 13 and the pinned layer 15 are anti-parallel to each other, the variable resistance layer 124 may be in a high resistance state, and this may indicate a digital data bit "1." In some implementations, the variable resistance layer 124 can be configured to store data bit '1' when the magnetization directions of the free layer 13 and the pinned layer 15 are parallel to each other and to store data bit '0' when the magnetization directions of the free layer 13 and the pinned layer 15 are anti-parallel to each other.

In some implementations, the variable resistance layer 124 may further include one or more layers performing various functions to improve a characteristic of the MTJ structure. For example, the variable resistance layer 124 may further include at least one of a buffer layer 11, an under layer 12, a spacer layer 16, a magnetic correction layer 17 and a capping layer 18.

The under layer 12 may be disposed under the free layer 13 and serve to improve perpendicular magnetic crystalline anisotropy of the free layer 13. The under layer 12 may have a single-layer or multilayer structure including a metal, a metal alloy, a metal nitride, or a metal oxide, or a combination thereof.

The buffer layer 11 may be disposed below the under layer 12 to facilitate crystal growth of the under layer 12, thus improving perpendicular magnetic crystalline anisotropy of the free layer 13. The buffer layer 11 may have a single-layer or multilayer structure including a metal, a metal alloy, a metal nitride, or a metal oxide, or a combination thereof. Moreover, the buffer layer 11 may be formed of or include a material having a good compatibility with a bottom electrode (not shown) in order to resolve the lattice constant mismatch between the bottom electrode and the under layer 12. For example, the buffer layer 11 may include tantalum (Ta).

The spacer layer 16 may be interposed between the magnetic correction layer 17 and the pinned layer 15 and function as a buffer between the magnetic correction layer 17 and the pinned layer 15. The spacer layer 16 may be used to improve characteristics of the magnetic correction layer 17. The spacer layer 16 may include a noble metal such as ruthenium (Ru).

The magnetic correction layer 17 may be used to offset the effect of the stray magnetic field produced by the pinned layer 15. In this case, the effect of the stray magnetic field of the pinned layer 15 can decrease, and thus a biased magnetic field in the free layer 13 can decrease. The magnetic correction layer 17 may have a magnetization direction anti-parallel to the magnetization direction of the pinned layer 15. In some implementations, when the pinned layer 15 has a downward magnetization direction, the magnetic correction layer 17 may have an upward magnetization direction. Conversely, when the pinned layer 15 has an upward magnetization direction, the magnetic correction layer 17 may have a downward magnetization direction. The magnetic correction layer 17 may be exchange coupled with the pinned layer 15 via the spacer layer 16 to form a synthetic anti-ferromagnet (SAF) structure. The magnetic correction layer 17 may have a single-layer or multilayer structure including a ferromagnetic material.

In some implementations, the magnetic correction layer 17 is located above the pinned layer 15, but the magnetic correction layer 17 may disposed at a different location. For example, the magnetic correction layer 17 may be located above, below, or next to the MTJ structure while the magnetic correction layer 17 is patterned separately from the MTJ structure.

The capping layer 18 may be used to protect the variable resistance layer 124 and/or function as a hard mask for patterning the variable resistance layer 124. In some implementations, the capping layer 18 may include various conductive materials such as a metal. In some implementations, the capping layer 18 may include a metallic material having almost none or a small number of pin holes and high resistance to wet and/or dry etching. In some implementations, the capping layer 18 may include a metal, a nitride, or an oxide, or a combination thereof. For example, the capping layer 18 may include a noble metal such as ruthenium (Ru).

The capping layer 18 may have a single-layer or multilayer structure. In some implementations, the capping layer 18 may have a multilayer structure including an oxide, or a metal, or a combination thereof. For example, the capping layer 18 may have a multilayer structure of an oxide layer, a first metal layer and a second metal layer.

A material layer (not shown) for resolving the lattice structure differences and the lattice constant mismatch between the pinned layer 15 and the magnetic correction layer 17 may be interposed between the pinned layer 15 and the magnetic correction layer 17. For example, this material layer may be amorphous and may include a metal a metal nitride, or metal oxide.

The selector layer 122 may function to reduce and/or suppress a leakage current between the memory cells 120 sharing the first conductive lines 110 or the second conductive lines 130. To this end, the selector layer 122 may have a threshold switching characteristic that blocks or substantially limits a current when a magnitude of an applied voltage is less than a predetermined threshold value and allows the current to increase rapidly when the magnitude of the applied voltage is equal to or greater than the predetermined threshold value. This threshold value may be referred to as a threshold voltage, and the selector layer 122 may have either a turned-on or "on" state or a turned-off or "off" state depending on the threshold voltage. The selector layer 122 may include an MIT (Metal Insulator Transition) material including a transition metal oxide such as $NbO_2$, $TiO_2$, $VO_2$, $WO_2$, or others, an MIEC (Mixed Ion-Electron Conducting) material such as $ZrO_2(Y_2O_3)$, $Bi_2O_3$—BaO, $(La_2O_3)_x(CeO_2)_{1-x}$, or others, an OTS (Ovonic Threshold Switching) material including chalcogenide material such as $Ge_2Sb_2Te_5$, $As_2Te_3$, $As_2$, $As_2Se_3$, or others, or a tunneling insulating material such as silicon oxide, silicon nitride, a metal oxide, or others. A thickness of the tunneling insulating layer is sufficiently small to allow tunneling of electrons under a given voltage or a given current. The selector layer 122 may include a single-layer or multilayer structure.

In some implementations, the selector layer 122 may perform a threshold switching operation through a doped region formed in a material layer for the selector layer 122. Thus, a size of the threshold switching operation region may be controlled by a distribution area of the dopants. The dopants may form trap sites for charge carriers in the material layer for the selector layer 122. The trap sites may capture the charge carriers moving in the selector layer 122 based on an external voltage applied to the selector layer 122. The trap sites thereby provide a threshold switching characteristic and are used to perform a threshold switching operation.

In some implementations, the selector layer 122 may include a dielectric material having incorporated dopants. The selector layer 122 may include an oxide with dopants, a nitride with dopants, or an oxynitride with dopants, or a combination thereof such as silicon oxide, titanium oxide, aluminum oxide, tungsten oxide, hafnium oxide, tantalum oxide, niobium oxide, silicon nitride, titanium nitride, aluminum nitride, tungsten nitride, hafnium nitride, tantalum nitride, niobium nitride, silicon oxynitride, titanium oxynitride, aluminum oxynitride, tungsten oxynitride, hafnium oxynitride, tantalum oxynitride, or niobium oxynitride, or a combination thereof. The dopants doped into the selector layer 122 may include an n-type dopant or a p-type dopant and be incorporated for example, by ion implantation process. Examples of the dopants may include one or more of boron (B), nitrogen (N), carbon (C), phosphorous (P), arsenic (As), aluminum (Al), silicon (Si) and germanium (Ge). For example, the selector layer 122 may include As-doped silicon oxide or Ge-doped silicon oxide.

In some implementations, each of the memory cells 120 includes the lower electrode layer 121, the selector layer 122, the middle electrode layer 123, the variable resistance layer 124 and the upper electrode layer 125. However, the memory cells 120 may have different structures. In some implementations, the relative positions of the selector layer 122 and the variable resistance layer 124 may be reversed. In some implementations, at least one of the lower electrode layer 121 and the upper electrode layer 125 may be omitted. In some implementations, in addition to the layers 121 to 125 shown in FIG. 1B, the memory cells 120 may further include one or more layers (not shown) for enhancing characteristics of the memory cells 120 or improving fabricating processes. For example, the memory cell 120 may include at least one of a lower electrode contact and an upper electrode contact. For example, a hard mask pattern may remain.

In some implementations, neighboring memory cells of the plurality of memory cells 120 may be spaced apart from each other at a predetermined interval, and trenches may be present between the plurality of memory cells 120. A trench between neighboring memory cells 120 may have a height to width ratio (i.e., an aspect ratio) in a range from 1:1 to 40:1, from 10:1 to 40:1, from 10:1 to 20:1, from 5:1 to 10:1, from 10:1 to 15:1, from 1:1 to 25:1, from 1:1 to 30:1, from 1:1 to 35:1, or from 1:1 to 45:1.

In some implementations, the trench may have sidewalls that are substantially perpendicular to an upper surface of the substrate 100. In some implementations, neighboring trenches may be spaced apart from each other by an equal or similar distance.

Although one cross-point structure has been described, two or more cross-point structures may be stacked in a vertical direction perpendicular to a top surface of the substrate 100.

A method for fabricating a semiconductor device will be explained with reference to FIGS. 2A to 2E. The detailed descriptions similar to those described In some implementations of FIGS. 1A, 1B and 1C will be omitted.

Figure 2A:
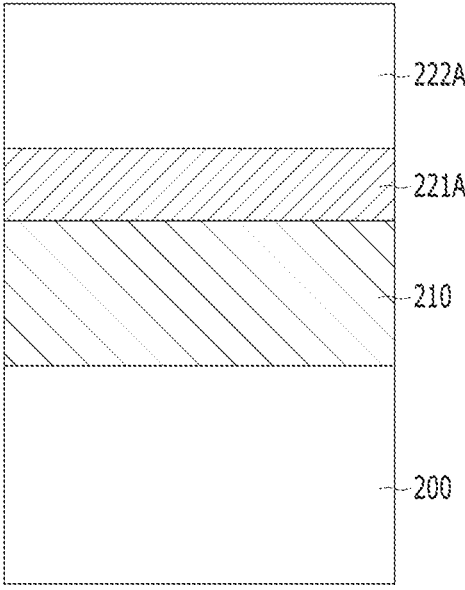
FIGS. 2A to 2E are cross-sectional views illustrating an example method for fabricating a semiconductor device based on some implementations of the disclosed technology.

Referring to FIG. 2A, first conductive lines 210 may be formed over a substrate 200 in which a predetermined structure is formed. For example, the first conductive lines 210 may be formed by forming a conductive layer for the first conductive lines 210 and etching the conductive layer using a mask pattern in a line shape extending in a first direction.

A material layer 221A for a lower electrode layer and a material layer 222A for a selector layer may be sequentially formed over the first conductive lines 210.

Figure 2B:
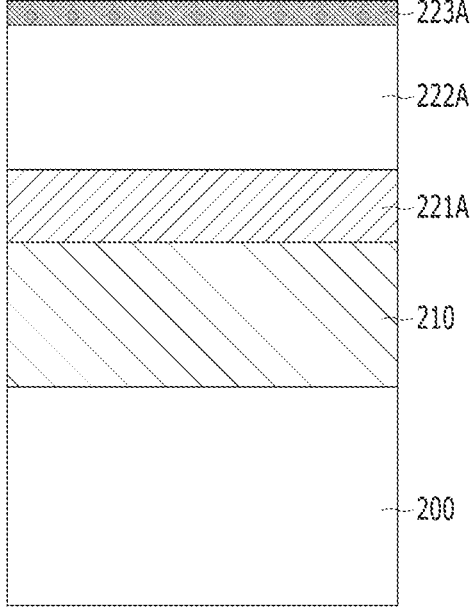

Referring to FIG. 2B, a material layer 223A for a middle electrode layer may be formed over the material layer 222A.

Figure 2C:
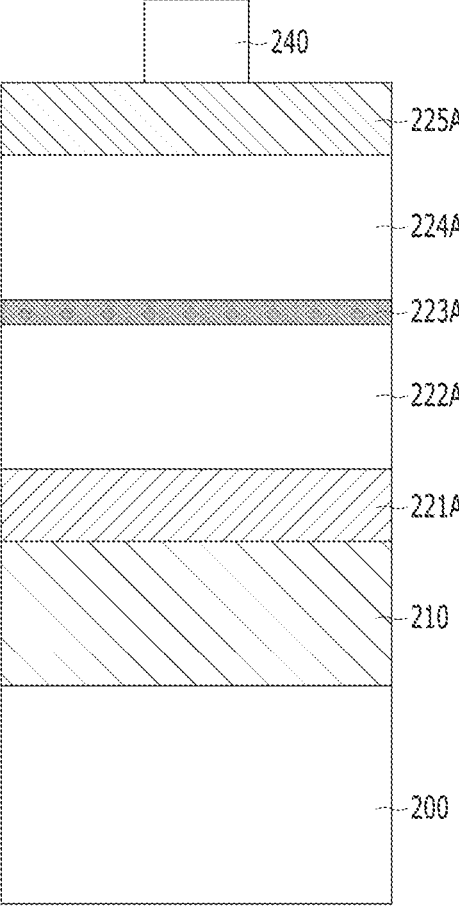
Figure 2D:
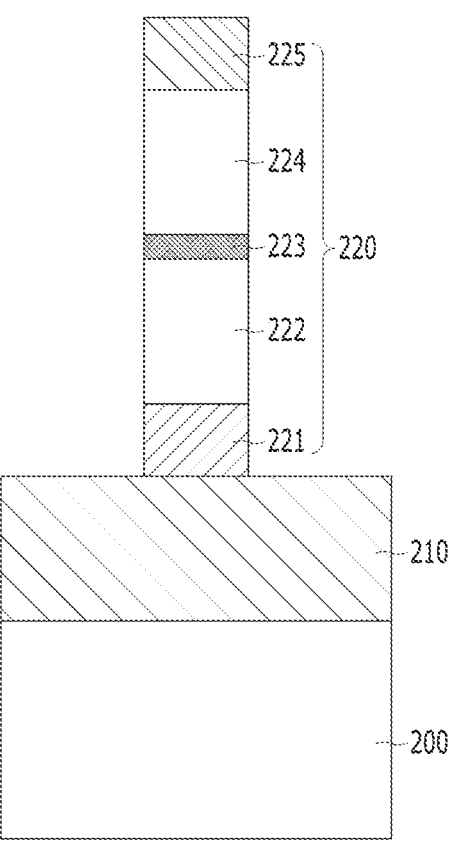

The material layer 223A may be a layer that forms a middle electrode layer 223 shown in FIG. 2D by a patterning process. That is, the material layer 223A may correspond to the middle electrode layer 223.

In some implementations of the disclosed technology, the material layer 223A for the middle electrode layer may include graphene.

The material layer 223A for the middle electrode layer may be formed as will be discussed below with reference to FIGS. 3A to 3D.

FIGS. 3A to 3D is cross-sectional views for illustrating forming the material layer 223A for the middle electrode layer based on some implementations of the disclosed technology.

Figure 3A:
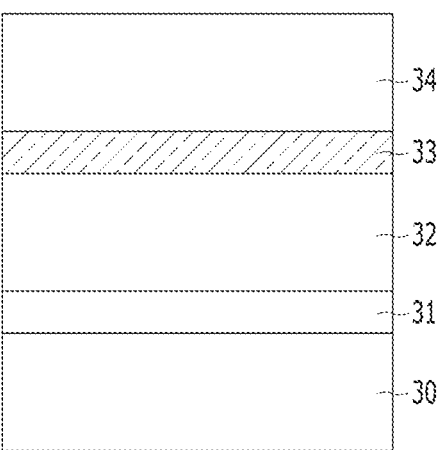
FIGS. 3A to 3D are cross-sectional views illustrating an example method for forming a material layer for a middle electrode layer included in a semiconductor device based on some implementations of the disclosed technology.

Referring to FIG. 3A, an insulating layer 31, a metal layer 32, a graphene layer 33 and a support layer 34 may be sequentially formed over an initial substrate 30.

The initial substrate 30 may include a semiconductor material, such as silicon.

The insulating layer 31 may include an oxide, a nitride, or a combination thereof. For example, the insulating layer 31 may include silicon oxide, aluminum oxide, or a combination thereof.

The metal layer 32 may have an excellent adsorption property to carbon and function as a catalyst for graphene synthesis. In some implementations, the metal layer 32 may include a transition metal having an excellent adsorption property to carbon. For example, the metal layer 32 may include nickel (Ni), copper (Cu), platinum (Pt), cobalt (Co), iridium (Ir), ruthenium (Ru), gold (Au), silver (Ag), germanium (Ge), iron (Fe), or a combination thereof.

The graphene layer 33 may be formed by chemical vapor deposition (CVD). For example, the initial substrate 30 on which the metal layer 32 and the insulating layer 31 are formed may be placed in a quartz tube and a temperature may be raised to about 1000° C. under an atmospheric pressure and $H_2$ gas atmosphere. Then, by treating the initial substrate 30 with a mixed gas of methane, hydrogen, helium, or the like, carbon atoms may be decomposed from the precursor methane. The decomposed carbon atoms may react with the metal layer 32 as a catalyst and an appropriate amount of carbon atoms may be dissolved in or adsorbed onto the metal layer 32. Subsequently, by cooling to room temperature, carbon atoms included in the metal layer 32 may be crystallized to form the graphene layer 33.

The graphene layer 33 may be formed using at least one of the commonly used chemical vapor deposition (CVD) methods.

The support layer 34 may serve to support the graphene layer 33 for the transfer of the graphene layer 33. The support layer 34 may include a polymer. For example, the support layer 34 may include poly(dimethylsiloxane) (PDMS), poly(methylmethacrylate) (PMMA), polycarbonate (PC), polyimide (PI), polystyrene (PS), polyethylene (PE), or a combination thereof.

In some implementations, the support layer 34 may be formed by bonding a solid polymer layer on the graphene layer 33 using a heat release tape or the like.

In some implementations, the support layer 34 may be formed by coating a polymer solution on the graphene layer 33. The coating method used for forming support layer 34 may include spin coating, roll-to-roll coating, spin spray coating, spray coating, dip coating, bar coating, brush coating, or slit coating, but is not limited thereto.

Figure 3B:
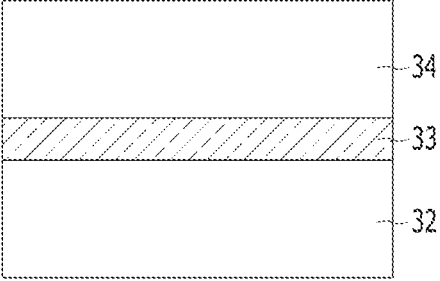

Referring to FIG. 3B, the initial substrate 30 and the insulating layer 31 may be removed.

An operation for separating the initial substrate 30 and the insulating layer 31 from the metal layer 32, the graphene layer 33 and the support layer 34 may be performed, for example, by mechanically peeling the laminated structure of FIG. 3A in water.

Figure 3C:
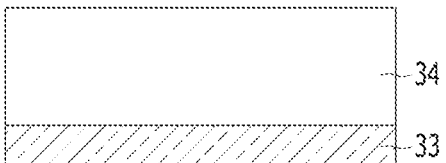

Referring to FIG. 3C, the metal layer 32 may be removed.

An operation for separating the metal layer 32 from the graphene layer 33 and the support layer 34 may be performed by etching the metal layer 32. For example, the metal layer 32 may be removed by a chemical etch process. An etchant for etching the metal layer 32 may be appropriately selected depending on the metal layer 32. Examples of the etchant may include $FeCl_3$, but are not limited thereto.

Figure 3D:
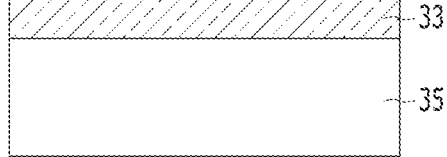

Referring to FIG. 3D, the graphene layer 33 may be formed on a target substrate 35.

The target substrate 35 may be a substrate on which the graphene layer 33 is finally formed. In some implementations, the target substrate 35 may correspond to the material layer 222A of FIG. 2A. The graphene layer 33 may correspond to the material layer 223A.

In some implementations, the graphene layer 33 may be formed on the target substrate by transferring graphene to the target substrate. The graphene transfer for forming the graphene layer 33 may be performed by using at least one of the commonly used material transfer techniques. For example, the graphene transfer for forming the graphene layer 33 may be performed by bringing the target substrate 35 into contact with the graphene layer 33 and heating them.

FIGS. 3A to 3D show the method for forming the graphene layer 33 by chemical vapor deposition (CVD). In addition to the method in FIGS. 3A to 3D, various methods may be used for graphene transfer for forming the graphene layer 33. In some implementations, the graphene layer 33 may be formed by a chemical vapor deposition (CVD) process and/or a transfer process. In some implementations, the graphene layer 33 may be formed by, in addition to or in lieu of the chemical vapor deposition (CVD) process, a mechanical peeling process, an epitaxial growth process, a chemical peeling process, or others. In some implementations, the graphene layer 33 may be formed by a roll-to-roll synthesis.

In the mechanical peeling process, graphene may be formed by peeling off one layer from a graphite crystal having a multilayer structure by mechanical force. For example, graphene may be formed by stacking graphite in layers on a substrate, performing a peeling process using a tape, and removing the remaining adhesive component through heat treatment in a reducing atmosphere.

In the epitaxial growth process, graphene may be formed by performing a heat treatment on a material having carbon such as silicon carbide (SiC) under a high temperature of about 1500° C. During the heat treatment, carbon grows along grains of a surface of SiC to form graphene.

The chemical peeling process may be performed to form graphene by using a redox property of graphite. In the chemical peeling process, graphene may be formed by forming graphite oxide by oxidizing graphite using a strong acid, an oxidizing agent or others, bringing graphite oxide into contact with water, allowing water molecules to penetrate spaces between layers of graphite oxide, which results from the high hydrophilicity of graphite oxide, forming a graphene oxide sheet by using a ultrasonic grinder after the interlayer spaces is widened by the water molecules, and removing impurities by a reduction process.

In the roll-to-roll synthesis, a deposition process, a printing process, a peeling process, an etch process and a transfer process are performed sequentially or continuously. For example, in the roll-to-roll synthesis, graphene may be formed by growing graphene on a copper substrate by CVD, attaching graphene to a polymer film having an adhesive by passing between two rollers, removing the copper substrate, removing adhesive between graphene and the polymer film, and transferring graphene to a final substrate.

Returning to FIG. 2B, the material layer 223A may be formed on the material layer 222A, for example, by the processes described in FIGS. 3A to 3D.

The material layer 223A may include graphene having a monolayer or multilayer structure.

In some implementations, the middle electrode layer 123 includes multilayer graphene that includes 2-7 layers.

The material layer 223A may have a very small thickness compared to the electrode formed of conventional conductive materials such as TiN.

The material layer 223A may have a smooth surface with a low surface roughness. For example, the material layer 223A may have a lower surface roughness compared to the electrode formed of conventional conductive materials such as TiN.

Referring to FIG. 2C, a material layer 224A for a variable resistance layer, a material layer 225A for an upper electrode layer and a hard mask pattern 240 may be sequentially formed on the material layer 223A.

Since the material layer 223A includes graphene having excellent impermeability, diffusion of materials included in the material layer 224A to the material layer 222A can be prevented or reduced during the formation of the material layer 224A on the material layer 223A.

Further, the material layer 223A has a very small thickness so that the thickness of the hard mask pattern 240 can be reduced, thereby reducing the process time and cost.

The hard mask pattern 240 may include a material having excellent etch selectivity and hardness in order to improve a vertical profile of the memory cell 220. For example, the hard mask pattern 240 may include various metal materials, carbon, or a combination thereof.

The hard mask pattern 240 may be formed by forming a hard mask (not shown) on the material layer 225A, forming a photoresist pattern (not shown) on the hard mask, and etching the hard mask using the photoresist pattern as an etch barrier. Before forming the photoresist pattern, an anti-reflection layer (not shown) may be further formed on the hard mask in order to prevent reflection during an exposure process.

Referring to FIG. 2D, the memory cell 220 in which a lower electrode layer 221, a selector layer 222, a middle electrode layer 223, a variable resistance layer 224 and an upper electrode layer 225 are sequentially stacked may be formed by etching the material layer 225A, the material layer 224A, the material layer 223A, the material layer 222A and the material layer 221A using the hard mask pattern 240 as an etch barrier.

In some implementations, the material layer 223A may not be etched by a separate additional etch process, but may be etched concurrently with the etching of the material layer 224A during the etch process for forming the memory cell 220, reducing or preventing damage to the selector layer 222 that would have resulted from the additional etch process and shunt failure of the variable resistance layer 224 that would have resulted from redeposition. In this way, it would be possible to reduce the process time and cost.

In an implementation, as shown in FIG. 2D, the hard mask pattern 240 is removed. However, in another implementation, the hard mask pattern 240 may remain.

Figure 2E:
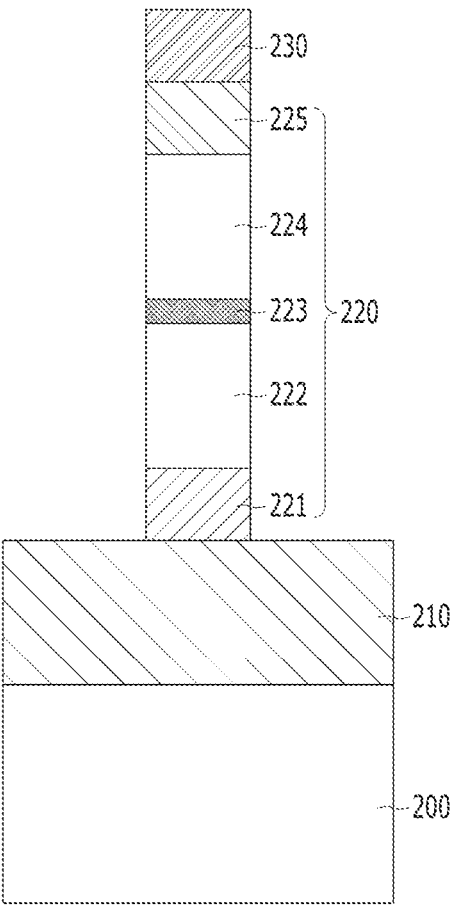

Referring to FIG. 2E, second conductive lines 230 may be formed on the upper electrode layer 225.

The second conductive lines 230 may be formed by forming a conductive layer for forming the second conductive lines 230 and etching the conductive layer using a mask pattern in a line shape extending in a second direction.

In this way, a semiconductor device of FIG. 2E may be formed. The semiconductor device may include the first conductive lines 210, the memory cell 220 and the second conductive lines 230 which are sequentially formed over the substrate. The memory cell 220 may include the lower electrode layer 221, the selector layer 222, the middle electrode layer 223, the variable resistance layer 224 and the upper electrode layer 225. The middle electrode layer 223 may include graphene having a monolayer or multilayer structure. The middle electrode layer 223 may have a very small thickness compared to an electrode layer made of commonly used conductive materials such as TiN. Since the middle electrode layer 223 has a smooth surface having a low surface roughness, the performance and yield of the variable resistance layer 224 can be improved. Further, since the middle electrode layer 223 may physically isolate or separate the selector layer 222 and the variable resistance layer 224 from each other, diffusion of materials between the layers can be effectively prevented or reduced.

The first conductive lines 210, the memory cell 220, the lower electrode layer 221, the selector layer 222, the middle electrode layer 223, the variable resistance layer 224, the upper electrode layer 225 and the second conductive lines 230 shown in FIG. 2E may correspond to the first conductive lines 110, the memory cell 120, the lower electrode layer 121, the selector layer 122, the middle electrode layer 123, the variable resistance layer 124, the upper electrode layer 125 and the second conductive lines 230 shown in FIG. 1B.

Only a few embodiments and examples are described. Enhancements and variations of the disclosed embodiments and other embodiments can be made based on what is described and illustrated in this patent document.

What is claimed is:

1. A semiconductor device comprising:
   first conductive lines;
   second conductive lines disposed on the first conductive lines to be spaced apart from the first conductive lines;
   selector layer disposed between the first conductive lines and the second conductive lines;
   a variable resistance layer disposed between the first conductive lines and the second conductive lines; and
   a first electrode layer including graphene and disposed between the variable resistance layer and the selector layer,
   wherein the graphene has a multilayer structure with two to seven layers.

2. The semiconductor device according to claim 1, wherein the first electrode layer is configured to physically isolate the variable resistance layer and the selector layer from each other and electrically connect the variable resistance layer and the selector layer to each other.

3. The semiconductor device according to claim 1, wherein the selector layer is disposed between the first conductive line and the first electrode layer, and the variable resistance layer is disposed between the first electrode layer and the second conductive line.

4. The semiconductor device according to claim 1, further comprising:
   a second electrode layer disposed between the first conductive line and the selector layer; and
   a third electrode layer disposed between the variable resistance layer and the second conductive line.

5. The semiconductor device according to claim 4, wherein the first electrode layer has a smaller thickness than at least one of the second electrode layer or the third electrode layer.

6. The semiconductor device according to claim 4, wherein the first electrode layer has a lower surface roughness than at least one of the second electrode layer or the third electrode layer.

7. The semiconductor device according to claim 1, further comprising a hard mask pattern disposed between the variable resistance layer and the second conductive line.

8. A method for fabricating a semiconductor device comprising:
   forming a first conductive line;
   forming a selector layer over the first conductive line;
   forming a first electrode layer that includes graphene over the selector layer;
   forming a variable resistance layer; and
   forming a second conductive line over the variable resistance layer,
   wherein the graphene has a multilayer structure with two to seven layers.

9. The method according to claim 8, wherein the selector layer is disposed between the first conductive line and the first electrode layer, and the variable resistance layer is disposed between the first electrode layer and the second conductive line.

10. The method according to claim 8, further comprising:
    forming a hard mask pattern over the variable resistance layer,
    wherein the selector layer, the first electrode layer and the variable resistance layer are stacked by etching the variable resistance layer, the first electrode layer and the selector layer using the hard mask pattern.

11. The method according to claim 8, further comprising:
    forming a second electrode layer after forming the first conductive line and before forming the selector layer, wherein the second electrode layer is disposed between the first conductive line and the selector layer; and
    forming a third electrode layer after forming the variable resistance layer and before forming the second conductive line, wherein third electrode layer is disposed between the variable resistance layer and the second conductive line.

12. The method according to claim 11, wherein the first electrode layer has a smaller thickness than at least one of the second electrode layer or the third electrode layer.

13. The method according to claim 11, wherein the first electrode layer has a lower surface roughness than at least one of the second electrode layer or the third electrode layer.

14. The method according to claim 8, wherein the forming of the first electrode layer comprises:
    forming a graphene layer on a metal layer formed over a substrate by performing a chemical vapor deposition (CVD);
    forming a support layer on the graphene layer;
    separating the metal layer, the graphene layer and the support layer from the substrate to remove the substrate;

separating the graphene layer and the support layer from the metal layer to remove the metal layer; and
transferring the graphene layer to the selector layer.

* * * * *